United States Patent
Seo et al.

(10) Patent No.: US 8,045,331 B2
(45) Date of Patent: Oct. 25, 2011

(54) PRINTED CIRCUIT BOARD, METHOD OF FABRICATING THE SAME, AND ELECTRONIC APPARATUS EMPLOYING THE SAME

(75) Inventors: Ho-Seong Seo, Suwon-si (KR); Young-Min Lee, Yongin-si (KR); Kyu-Sub Kwak, Suwon-si (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 681 days.

(21) Appl. No.: 12/188,319

(22) Filed: Aug. 8, 2008

(65) Prior Publication Data
US 2009/0040704 A1    Feb. 12, 2009

(30) Foreign Application Priority Data

Aug. 9, 2007   (KR) .......................... 10-2007-0080098

(51) Int. Cl.
*H01L 23/52* (2006.01)
*H01L 23/02* (2006.01)
*H01L 21/48* (2006.01)

(52) U.S. Cl. ........ 361/748; 361/737; 361/760; 361/767; 361/784; 257/696; 257/692; 257/668; 257/673; 257/690; 257/724; 257/737; 29/832; 29/841; 29/846; 438/106; 438/108; 438/124; 174/254; 174/260; 174/267; 439/67; 439/71; 439/591

(58) Field of Classification Search .................. 361/732, 361/737, 748, 752–754, 760–767, 771, 772, 361/774, 784–787, 790–794, 775, 823; 257/668, 257/686, 690–698, 720–724, 737, 773, 777, 257/787; 174/254–267, 524, 527, 551; 438/106, 438/108, 111–113, 115, 127, 124, 121, 613–615; 439/56, 71, 79, 591, 862, 891; 29/830, 832, 29/841, 846, 852, 593

See application file for complete search history.

(56) References Cited

U.S. PATENT DOCUMENTS

| | | | | |
|---|---|---|---|---|
| 5,258,330 A | * | 11/1993 | Khandros et al. | 29/593 |
| 6,211,572 B1 | * | 4/2001 | Fjelstad et al. | 257/781 |
| 6,475,833 B2 | * | 11/2002 | Lin | 438/121 |

* cited by examiner

Primary Examiner — Michail V Datskovskiy
(74) Attorney, Agent, or Firm — Cha & Reiter, LLC

(57) ABSTRACT

A printed circuit board includes a core layer, an insulation layer formed on the core layer and having a cavity formed on a part of the insulation layer, and a circuit pattern formed on the insulation layer, wherein the circuit pattern comprises one or more external terminals positioned above the cavity.

11 Claims, 6 Drawing Sheets

PRINTED CIRCUIT BOARD, METHOD OF FABRICATING THE SAME, AND ELECTRONIC APPARATUS EMPLOYING THE SAME

CLAIM OF PRIORITY

This application claims the benefit under 35 U.S.C. §119(a) of an application entitled "Printed Circuit Board, Method of Fabricating the Same, and Electronic Apparatus Employing the Same," filed in the Korean Intellectual Property Office on Aug. 9, 2007 and assigned Serial No. 2007-80098, the contents of which are hereby incorporated by reference in their entirety.

BACKGROUND OF THE INVENTION

1. Field of the Invention

The present invention relates to a printed circuit board, and in particular to a printed circuit board with an external terminal.

2. Description of the Related Art

A printed circuit board has a structure configured by forming a conductive layer on an insulation layer, such as a core layer, and forming a circuit pattern on the conductive layer. Such a printed circuit board may be employed in an electronic apparatus, such as a computer, a portable electronic terminal, etc., in which a plurality of electronic parts are integrated.

The above-mentioned circuit pattern may include a plurality of internal terminals for connecting electronic parts, and one or more external terminals electrically connectable to an external electronic apparatus or a printed circuit board of a counterpart.

FIG. 1 is a cross-sectional view showing a printed circuit board according to the prior art. Referring to FIG. 1, the conventional printed circuit board includes a core layer 110, an insulation layer 12 1 formed on the core layer 110, an elastic portion 122 inserted into the insulation layer 121, and a circuit pattern formed on the elastic portion 122 and the insulation layer 121.

The circuit pattern includes a plurality of external and internal terminals 131a and 131b; 132a and 132b, providing electric contacts. The external terminals 131a and 131b can be formed on the elastic portion so as to provide electric contacts with a counterpart printed circuit board or an external electronic apparatus.

The elastic portion 122 may be embedded in the insulation layer or exposed at the top thereof, and provides elasticity to the external terminals 131a and 131b so that the electric contacts with external devices are continuously maintained.

In the formation of printed circuit board 100, the insulation layer 121 is grown on the core layer 110, and then a part of the insulation layer 121 is selectively removed. The elastic portion 122 is formed in the previously removed portion of insulation layer 121. The elastic portion 122 may provide elasticity to the external terminals formed on the top of the elastic portion 122.

However, the elastic portion 122 and the external terminals 131a and 131b on the printed circuit board can peel off due to accumulation of fatigue and excessive physical force due to depressing and degradation of elasticity. In order to minimize this problem, a spiral contact process may be employed, which separately forms the circuit pattern and the core layer and assembles them with lamination. However, this process is difficult in alignment, and is complicated.

SUMMARY OF THE INVENTION

Accordingly, the present invention solves the above-mentioned problems occurring in the prior art and provides additional advantages, by providing a printed circuit board having one or more external terminals capable of continuously maintaining external electric contacts and minimizing the occurrence of degradation due to peeling.

According to an aspect of the present invention, there is provided a printed circuit board including a core layer, an insulation layer formed on the core layer and having a cavity formed on a part of the insulation layer, and a circuit pattern formed on the insulation layer, wherein the circuit pattern includes at least one external terminal substantially positioned above the cavity.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE INVENTION

Figure 1:
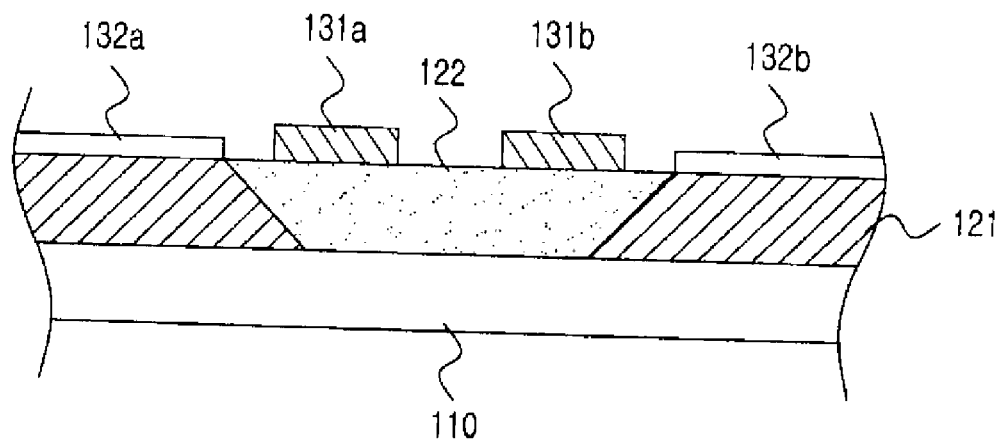
FIG. 1 shows a part of a cross-section of a prior art printed circuit board.

Hereinafter, the exemplary embodiments of the present invention will be described with reference to the accompanying drawings. It should be noted that in the following description, the same elements will be designated by the same reference numerals even though they are shown in different drawings. For the purposes of clarity and simplicity, a detailed description of known functions and configurations incorporated herein may be omitted when it may make the subject matter of the present invention rather unclear when their inclusion would obscure appreciation of the subject matter of the present invention by a person of ordinary skill in the art.

Figure 2:
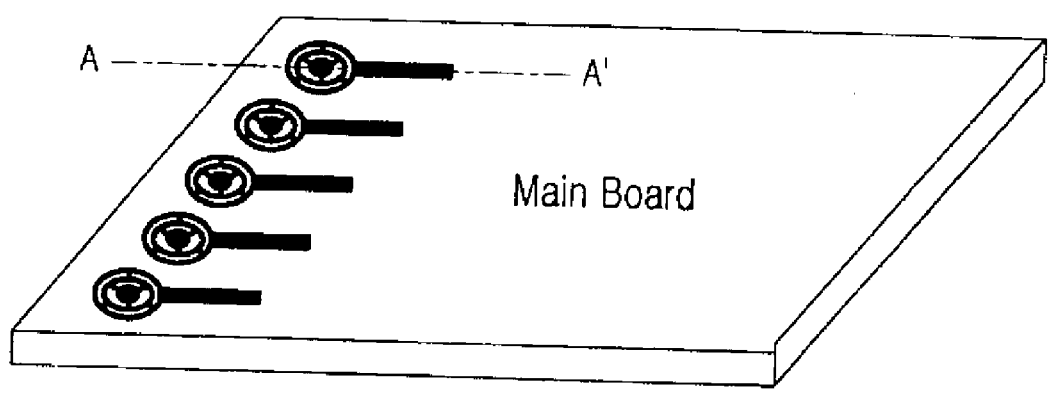
FIG. 2 shows a printed circuit board according to a first embodiment of the present invention.
Figure 3:
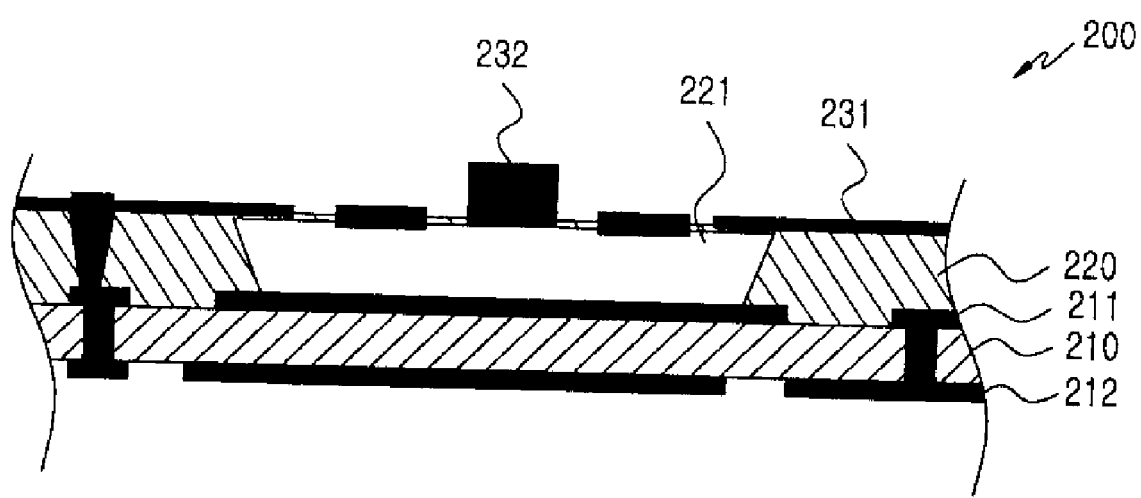
FIG. 3 shows a part of a cross-section taken along line A-A' of FIG. 2.

FIG. 2 shows a printed circuit board according to a first embodiment of the present invention, and FIG. 3 shows a part of a cross-section taken along line A-A' of FIG. 2. Referring to FIGS. 2 and 3, the printed circuit board 200 according to the present embodiment includes a core layer 210, an insulation layer 220 positioned on the core layer 210 and having a cavity 221 exposing a part of the top of the core layer 210, and a circuit pattern formed on the insulation layer 220.

The core layer 210 may be formed with conductive patterns 211 and 212 on the opposite sides thereof. Conductive patterns 211 and 212 can be electrically connected to the circuit patterns 231 and 232 on the insulation layer 220 through, for example, conductive filler filled in via holes.

The circuit patterns 231 and 232 formed on the insulation layer 220 may consist of an external terminal 232 positioned above the cavity 221 and a plurality of internal terminals 231, the height of which is lower than that of the external terminal 232.

Because the external terminal 232 can be formed through bumping in a shape protruding beyond the internal terminals 231, the external terminal 232 makes it easy to form an electric contact with a counterpart printed circuit board or an external electronic apparatus. In addition, each of the internal terminals 231 is formed in a circular or rectangular spiral line about the external terminal 232, so that the internal terminals 231 are capable of providing the external terminal with elasticity in cooperation with the cavity 221.

The above-mentioned bumping is a process for forming protrusions of a conductive material, such as gold, solder, nickel, etc., on a wafer subjected to an entire semiconductor process so as to ensure good electric flow. Especially, the bumping is substituted for wire bonding which implements electric connection with one or more metal wires, and the application of the bumping is extended centering around non-memory semiconductor devices which require high integration within a small space.

FIGS. 5a to 5g show the steps of fabricating the printed circuit board shown in FIG. 2. Referring to FIGS. 5a to 5g, the inventive printed circuit board 200 may be fabricated through the steps of forming conductive patterns 211 and 212 on a core layer 210, forming an insulation layer 220 on the core layer 210 formed with the conductive patterns 211 and 212, etching a part of the insulation layer 220, thereby forming a cavity, filling the cavity 221 with a filler member 240, forming circuit patterns 231 on the insulation layer 220 filled with the filler member 240, and removing the filler member 240.

Figure 5A:
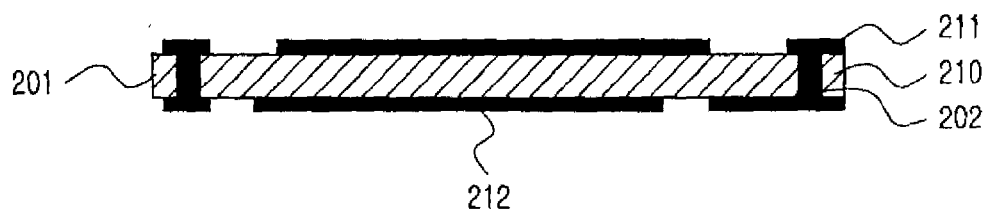
FIGS. 5a to 5g show the steps of fabricating the printed circuit board shown in FIG. 2.

FIG. 5a is a cross-sectional view showing a state in which the conductive patterns 211 and 212 are formed on the core layer 210, wherein the respective patterns 211 and 212 formed on the top and bottom of the core layer 210 are electrically connected with each other through via holes 201 and 202 extending through the core layer 210.

Figure 5B:
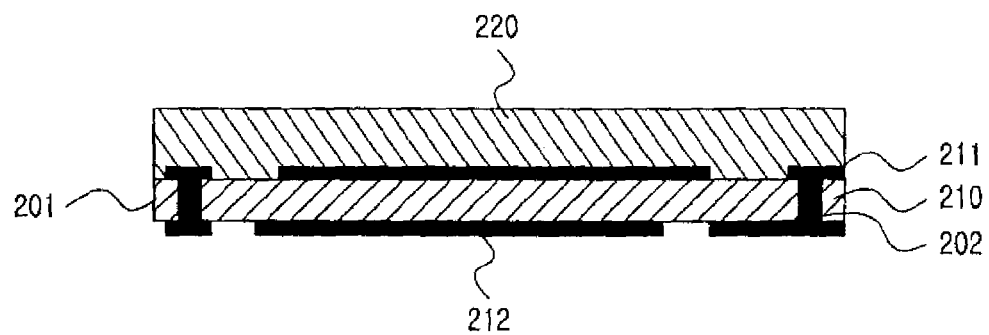
Figure 5C:
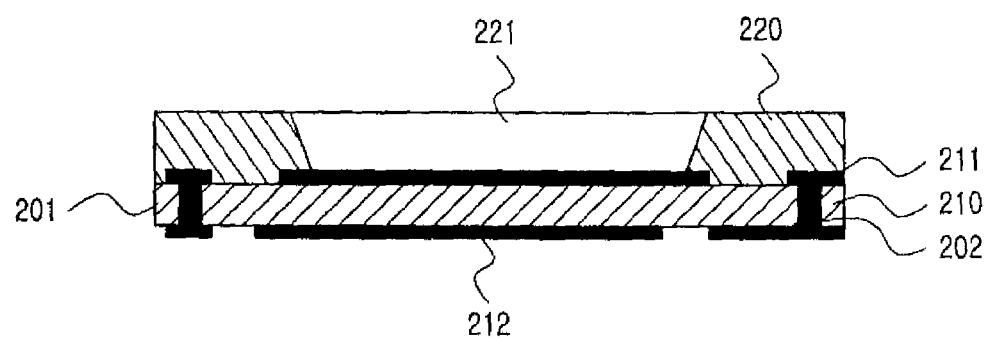

FIG. 5b is a cross-sectional view showing a state in which the insulation layer 220 is grown on the top of the core layer 210 shown in FIG. 5a. FIG. 5c is a cross-sectional view showing a state in which a part of the insulation layer 220 is removed and the cavity 221 is formed. The cavity 221 exposes a part of the top surface of the core layer 210 or pattern 211 to the external atmosphere, and the cavity 221 may be formed by etching or a similar process.

Figure 5D:
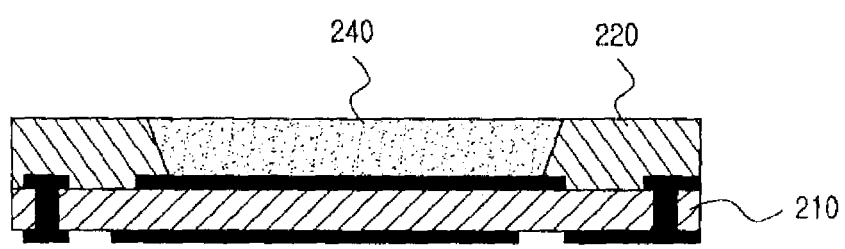
Figure 5E:
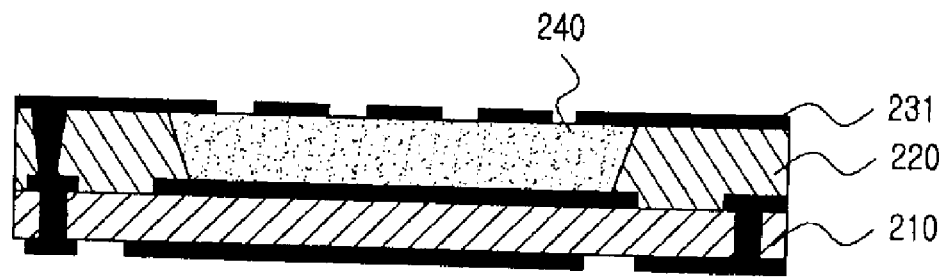

FIG. 5d is a cross-sectional view showing a state in which the cavity 221 is filled with the filler member 240. FIG. 5e is a cross-sectional view showing a state in which the circuit patterns 231 are formed on the insulation layer 220 and/or filler member 240.

Figure 4A:
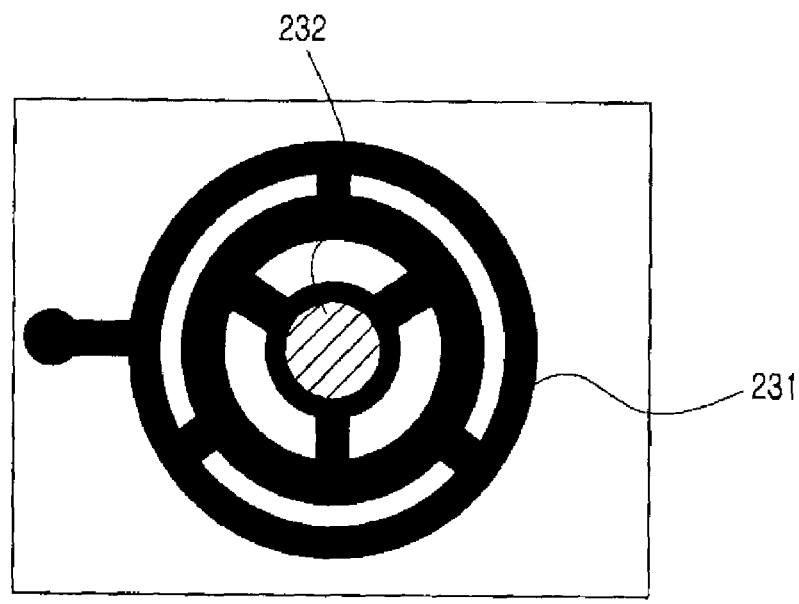
FIGS. 4a and 4b show plan views of external terminals employed in the embodiment shown in FIG. 2.
Figure 4B:
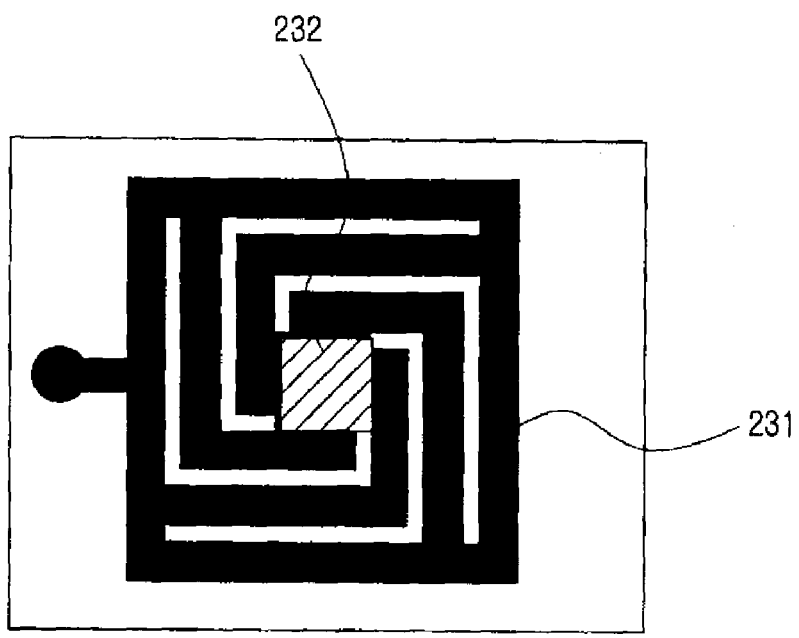
Figure 5F:
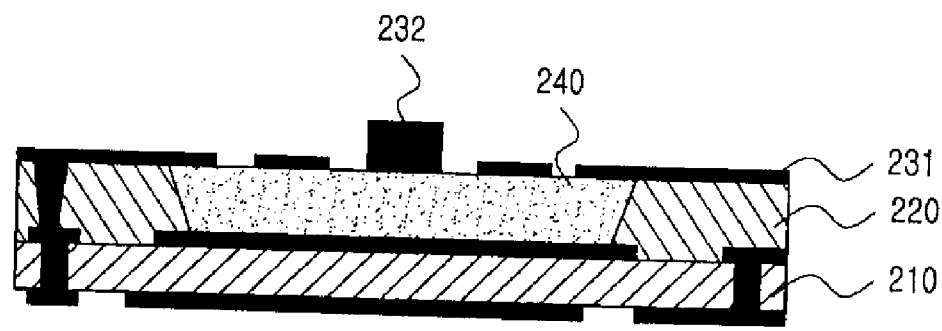

FIG. 5f is a cross-sectional view showing a state in which an external terminal 232 in a form of a protrusion is formed, by bumping or the like, on at least one of the internal terminals 231 positioned on the filler member 240 among the internal terminals shown in FIG. 5e. The internal terminals 231 formed on the top of filler member 240 may be formed in a spiral shape centering around the external terminal 232 as shown as examples in FIGS. 4a and 4b.

Figure 5G:
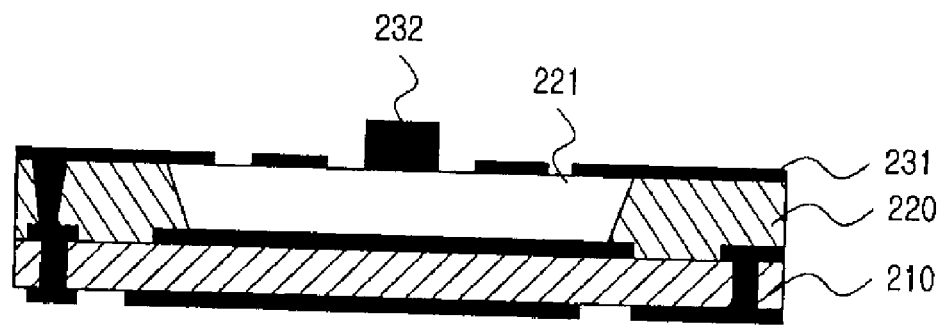

FIG. 5g is a cross-sectional view of a printed circuit board from which the filler member 240 is selectively removed.

Figure 6:
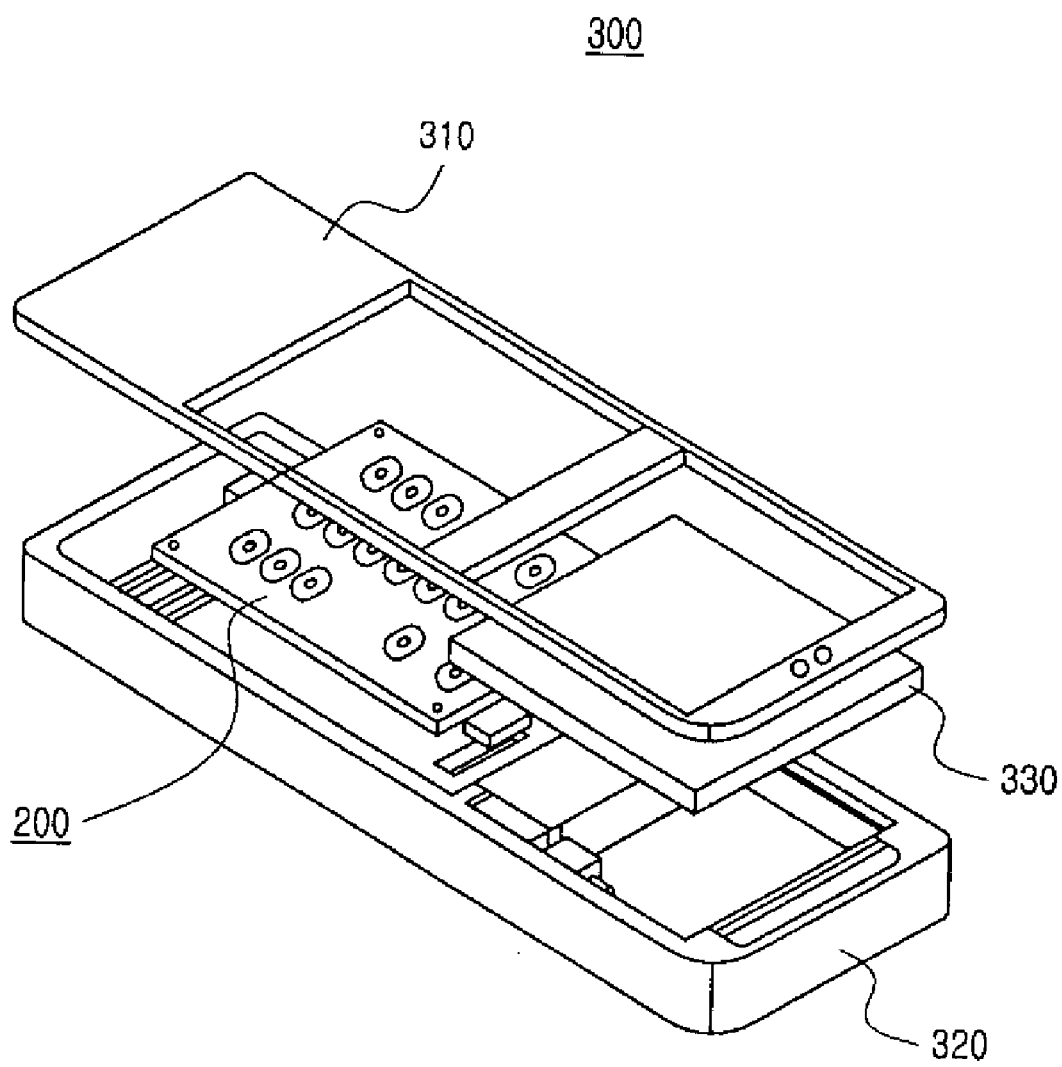
FIG. 6 shows an electronic apparatus for mounting the printed circuit board of FIG. 2 as a second embodiment of the present invention.

FIG. 6 shows an electronic apparatus for mounting the printed circuit board of FIG. 2 as a second embodiment of the present invention. The electronic apparatus shown in FIG. 6 includes housings 310 and 320, a printed circuit board 200 mounted in the housings 310 and 320, and an image display means 330.

The printed circuit board 200 is the same as that of the first embodiment of the present invention. The printed circuit board 200 includes an insulation layer 220 with a cavity 221, and circuit patterns composed of internal and external terminals 231 and 232 formed on the insulation layer 220 and cavity 221, the external terminal 232 being formed above the cavity 221 to more highly protrude as compared to the internal terminals 231.

It is possible to form one or more external terminals 232 on the printed circuit board 200, wherein the external terminals 232 may be used as electric contacts for electric connection with the image display means 330 or an external part of the electronic apparatus, or for forming the electric contacts of the housings 310 and 320.

The inventive external terminal 232 can be positioned above the cavity 221 without directly contacting the top of the insulation layer 220. As a result, it is possible to suppress the occurrence of degradation, such as peeling which is produced in a prior art printed circuit board by accumulation of fatigue and excessive physical force.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A printed circuit board comprising:
   a core layer,
   an insulation layer formed on the core layer having a cavity, and
   a circuit pattern formed on the insulation layer, wherein the circuit pattern comprises one or more external terminals substantially positioned above the cavity.

2. The printed circuit board as claimed in claim 1, wherein the circuit pattern further comprises a plurality of internal terminals, the height of which is lower than that of the external terminal.

3. The printed circuit board as claimed in claim 2, wherein the external terminal comprises a bump which protrudes higher than at least one of the plurality of internal terminals.

4. A method of fabricating a printed circuit board comprising the steps of:
   forming a core layer and a conductive pattern on the core layer,
   forming an insulation layer on the core layer,
   removing at least a portion of the insulation layer, thereby forming a cavity,
   filling the cavity with a filler member,
   forming a circuit pattern on the filler member and the insulation layer, the circuit pattern consisting of internal and external terminals, and
   removing at least a portion of the filler member such that at least one external terminal is substantially positioned over the removed portion.

5. The method as claimed in claim 4, wherein the at least one of the external terminals is formed through bumping to more highly protrude as compared to the internal terminals.

6. An electronic apparatus comprising:
   at least one housing, and
   a printed circuit board mounted in the housing, wherein the printed circuit board comprises an insulation layer with a cavity, at least one internal terminal formed on the insulation layer, and at least one external terminal substantially positioned over the cavity.

7. The electronic apparatus as claimed in claim 6, further comprising image display means for providing a user with image information.

8. The printed circuit board as claimed in claim 1, wherein the circuit pattern further comprises a plurality of internal terminals having a spiral shape centering around at least one of the one or more external terminal.

9. The printed circuit board as claimed in claim 1, wherein the cavity is substantially empty.

10. The method of claim 4, wherein the forming step further comprises forming at least a portion of the external and internal terminals in a spiral shape centering around at least one of the external terminals.

11. The method of claim 4, wherein the removed portion is substantially empty.

* * * * *